United States Patent
Isaji et al.

(10) Patent No.: US 10,586,682 B2
(45) Date of Patent: Mar. 10, 2020

(54) METHOD OF OBTAINING BEAM DEFLECTION SHAPE AND METHOD OF OBTAINING ARRANGEMENT ANGLE OF BLANKING APERTURE ARRAY PLATE

(71) Applicant: NuFlare Technology, Inc., Yokohama-shi (JP)

(72) Inventors: Shunsuke Isaji, Kouza-gun (JP); Rieko Nishimura, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/207,412

(22) Filed: Dec. 3, 2018

(65) Prior Publication Data

US 2019/0172678 A1 Jun. 6, 2019

(30) Foreign Application Priority Data

Dec. 4, 2017 (JP) ................. 2017-232635

(51) Int. Cl.
*H01J 37/304* (2006.01)
*H01J 37/317* (2006.01)
(Continued)

(52) U.S. Cl.
CPC .......... *H01J 37/304* (2013.01); *H01J 37/045* (2013.01); *H01J 37/147* (2013.01); *H01J 37/3005* (2013.01); *H01J 37/3177* (2013.01); *H01J 2237/0435* (2013.01); *H01J 2237/24542* (2013.01); *H01J 2237/31774* (2013.01);
(Continued)

(58) Field of Classification Search
CPC ...... H01J 37/304; H01J 37/045; H01J 37/147; H01J 37/3005; H01J 37/3177; H01J 2237/0453; H01J 2237/24542; H01J 2237/31774; H01J 2237/31776; H01J 2237/31798

See application file for complete search history.

(56) References Cited

U.S. PATENT DOCUMENTS

| 6,225,025 | B1* | 5/2001 | Hoshino | ................ | B82Y 10/00 |
| | | | | | 430/296 |
| 2014/0319367 | A1* | 10/2014 | Muraki | ................ | H01J 37/045 |
| | | | | | 250/397 |
| 2016/0349626 | A1* | 12/2016 | Matsumoto | ......... | H01J 37/3174 |

FOREIGN PATENT DOCUMENTS

| JP | 2001-144007 | 5/2001 |
| JP | 4563756 | 10/2010 |

(Continued)

*Primary Examiner* — Nicole M Ippolito
*Assistant Examiner* — Sean M Luck
(74) *Attorney, Agent, or Firm* — Oblon, McClelland, Maier & Neustadt, L.L.P.

(57) ABSTRACT

In one embodiment, a method of obtaining a beam deflection shape includes using a plurality of beams to write a line pattern on a substrate by deflecting the plurality of beams, the plurality of beams being beams in the i-th row (i is an integer satisfying $1 \leq i \leq m$) among multiple charged-particle beams including beams of m rows and n columns (m and n are integers equal to or greater than two), the deflection being performed in such a manner that a writing area for a beam in the j-th column (j is an integer satisfying $1 \leq j \leq n-1$) is continuously adjacent to a writing area for a beam in the (j+1)th column, measuring a degree of unevenness of an edge of the line pattern, and obtaining a deflection shape of the beam based on the degree of unevenness.

10 Claims, 7 Drawing Sheets

(51) Int. Cl.
*H01J 37/147* (2006.01)
*H01J 37/30* (2006.01)
*H01J 37/04* (2006.01)

(52) U.S. Cl.
CPC ............... *H01J 2237/31776* (2013.01); *H01J 2237/31798* (2013.01)

(56) References Cited

FOREIGN PATENT DOCUMENTS

| | | |
|---|---|---|
| JP | 2014-7379 | 1/2014 |
| JP | 2016-134486 | 7/2016 |
| JP | 2017-28284 | 2/2017 |

\* cited by examiner

FIG. 7A
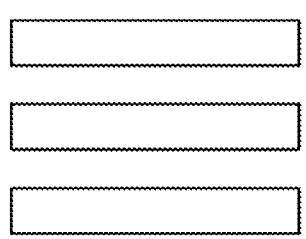
FIG. 7B
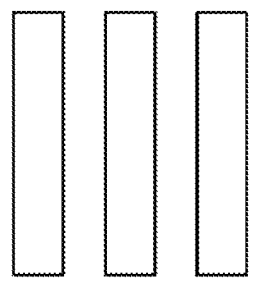
FIG. 8
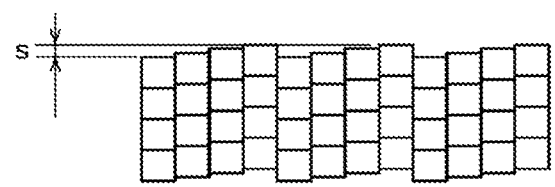
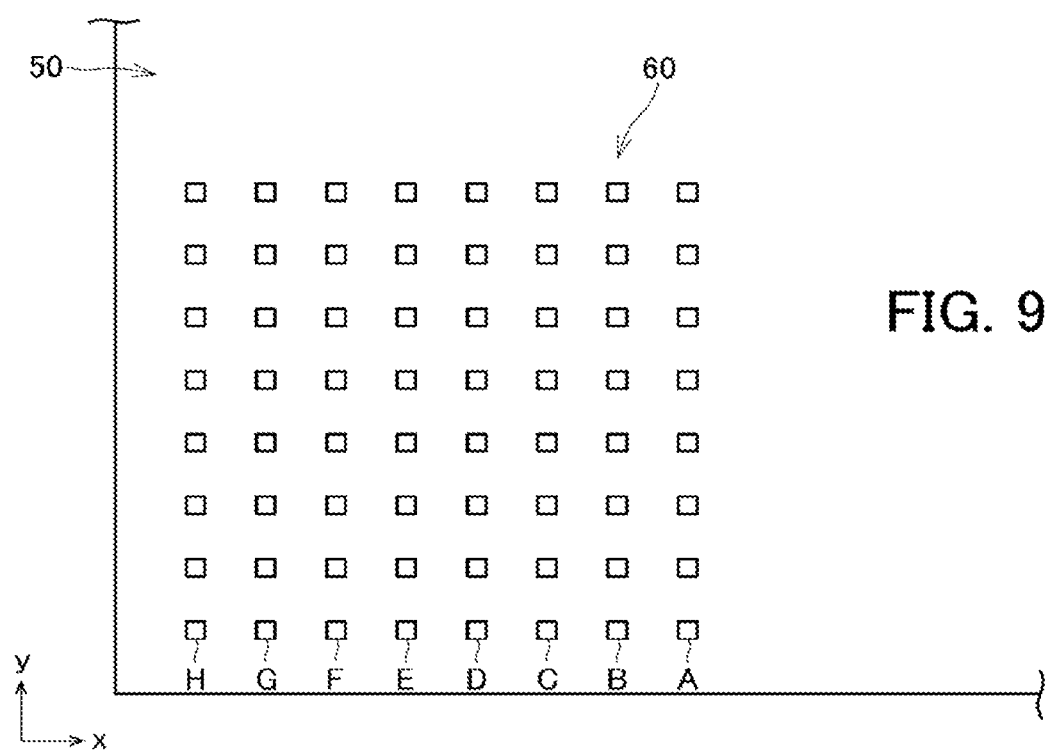
FIG. 9

METHOD OF OBTAINING BEAM DEFLECTION SHAPE AND METHOD OF OBTAINING ARRANGEMENT ANGLE OF BLANKING APERTURE ARRAY PLATE

CROSS REFERENCE TO RELATED APPLICATION

This application is based upon and claims benefit of priority from the Japanese Patent Application No. 2017-232635, filed on Dec. 4, 2017, the entire contents of which are incorporated herein by reference.

FIELD

The present invention relates to a method of obtaining beam deflection shape and a method of obtaining arrangement angle of blanking aperture array plate.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

Compared with the case of performing writing by using a single electron beam, a writing apparatus using multiple beams may emit many beams at a time, achieving a considerable increase in the throughput. For example, in a multibeam writing apparatus using a blanking aperture array, which is one embodiment of a multibeam writing apparatus, an electron beam emitted from a single electron gun passes through a shaping aperture array having multiple openings. Thus, multiple beams (multiple electron beams) are formed. The multiple beams pass through the respective blankers of the blanking aperture array. The blanking aperture array includes electrode pairs for deflecting the beams individually, and also includes openings through which the beams pass and which are disposed between the respective electrode pairs. The potential of one electrode of an electrode pair (blanker) is fixed to the ground potential, and the potential of the other electrode is switched between the ground potential and a potential different from the ground potential. Thus, blanking deflection is performed on the passing electron beams individually. Electron beams deflected by blankers are blocked, and electron beams which have not been deflected are emitted onto a sample.

In a multibeam writing method, multiple beams are collectively deflected so that writing is performed by using a single electron beam in an area between adjacent electron beams (hereinafter referred to as a subfield). Multiple beams are arranged at equal intervals in a matrix on a sample surface. Therefore, the shape of each of the subfields which corresponds to an area in which the corresponding beam is deflected is square.

The subfields may be rotated due to the positional relationship between the electrodes included in a deflector and an influence of the output characteristics of an amplifier connected to the deflector. Accordingly, the accuracy in a connecting portion between adjacent subfields may be degraded, causing degradation in the pattern writing accuracy. The size of each subfield is small, and it is difficult to obtain an accurate amount of rotation for adjustment.

In a multibeam writing apparatus, when the blanking aperture array having been rotated from a desired position is mounted, the pattern writing accuracy may be degraded. Therefore, it is necessary to obtain the arrangement angle of the blanking aperture array for adjustment of the arrangement angle. Alternatively, it is necessary to adjust, by using lenses, the angle of rotation of a multibeam image.

BRIEF DESCRIPTION OF THE DRAWINGS

FIGS. 7A and 7B are diagrams illustrating exemplary evaluation patterns.

FIG. 8 is a diagram for describing a method of measuring the degree of unevenness of an edge of a line pattern.

FIG. 9 is a diagram illustrating an ideal multibeam image.

FIGS. 11A to 11C are diagrams for describing an exemplary writing operation.

DETAILED DESCRIPTION

In one embodiment, a method of obtaining a beam deflection shape includes using a plurality of beams to write a line pattern on a substrate by deflecting the plurality of beams, the plurality of beams being beams in the i-th row (i is an integer satisfying $1 \leq i \leq m$) among multiple charged-particle beams including beams of m rows and n columns (m and n are integers equal to or greater than two), the deflection being performed in such a manner that a writing area for a beam in the j-th column (j is an integer satisfying $1 \leq j \leq n-1$) is continuously adjacent to a writing area for a beam in the (j+1)th column, a resist being applied on the substrate, measuring a degree of unevenness of an edge of the line pattern, and obtaining a deflection shape of the beam based on the degree of unevenness.

Hereinafter, an embodiment of the present invention will be described based on the drawings. In the embodiment, as an example of a charged particle beam, a configuration using an electron beam will be described. However, the charged particle beam is not be limited to an electron beam, and may be an ion beam or the like.

Figure 1:
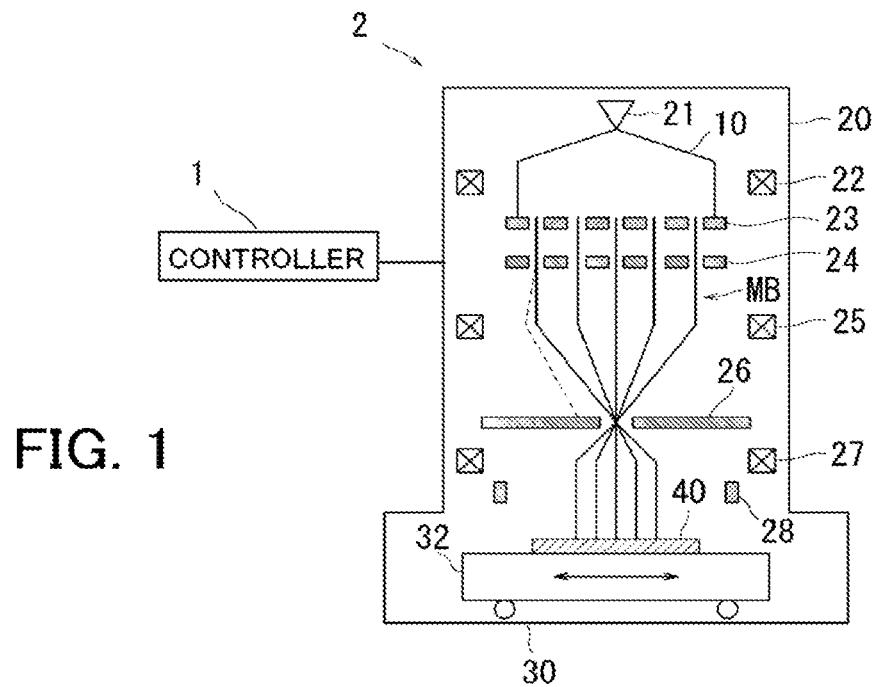
FIG. 1 is a schematic diagram illustrating a multiple charged-particle beam writing apparatus according to an embodiment of the present invention.

FIG. 1 is a schematic configuration view of a writing apparatus according to the present embodiment. The writing apparatus includes a controller 1 and a writing unit 2. The writing apparatus is an exemplary multiple charged-particle beam writing apparatus. The writing unit 2 includes an electron optical column 20 and a writing chamber 30. In the electron optical column 20, an electron gun 21, an illumination lens 22, a shaping aperture array plate 23, a blanking aperture array plate 24, a reduction lens 25, a limiting aperture member 26, an objective lens 27, and a deflector 28 are disposed. Both of the reduction lens 25 and the objective lens 27 are formed by using electromagnetic lenses. The reduction lens 25 and the objective lens 27 form a demagnifying optical system. The shaping aperture array plate 23 and the blanking aperture array plate 24 are mounted on a rotatable stage.

An XY stage 32 is disposed in the writing chamber 30. A substrate 40 that is a writing target is mounted on the XY stage 32. The substrate 40 is, for example, an exposure mask used when semiconductor devices are manufactured, a semiconductor substrate (silicon wafer) on which semiconductor devices are manufactured, or mask blanks to which a resist has been applied and on which writing has not been performed.

On the shaping aperture array 23, holes (openings) of m rows and n columns (m, n 2) are formed in a matrix in a predetermined array pitch. Each hole is formed in the same-sized rectangular or circular shape.

The illumination lens 22 causes an electron beam 10, which is emitted from the electron gun 21, to radiate onto the entire shaping aperture array plate 23 almost vertically. The electron beam 10 passes through the multiple holes of the shaping aperture array plate 23. Thus, electron beams (multiple beams) MB of m rows and n columns are formed.

In the blanking aperture array plate 24, through holes are formed in agreement with the positions at which the respective holes of the shaping aperture array plate 23 are disposed. For each through hole, a pair of two electrodes (blanker: blanking deflector) is disposed. For one of the two electrodes for each beam, an amplifier for applying a voltage is disposed. The other electrode is grounded. The electron beam passing through each through hole is independently deflected by using the voltage applied to the pair of two electrodes. Blanking control is exerted through this electron beam deflection.

The multiple beams MB having passed through the blanking aperture array plate 24 are demagnified by using the reduction lens 25, and travel toward the center hole formed in the limiting aperture member 26. Electron beams deflected by using blankers of the blanking aperture array plate 24 are displaced from the center hole of the limiting aperture member 26, and are blocked by the limiting aperture member 26. In contrast, electron beams which have not been deflected by blankers pass through the center hole of the limiting aperture member 26.

Thus, the limiting aperture member 26 blocks the beams which are deflected by blankers so as to enter the beam OFF state. Beams for one shot are formed by using the beams which have passed through the limiting aperture member 26 and which are formed during a period from start of the beam ON state to start of the beam OFF state.

The multiple beams MB having passed through the limiting aperture member 26 come into focus by using the objective lens 27, form a pattern image of a desired reduction ratio, is collectively deflected by the deflector 28, and irradiates the substrate 40. For example, while the XY stage 32 continuously moves, the deflector 28 exerts control so that the irradiation positions of the beams track the move of the XY stage 32.

The multiple beams MB radiated at a time are arranged ideally in the pitch obtained by multiplying the arrangement pitch of the holes of the shaping aperture array plate 23 by the desired reduction ratio described above. The writing apparatus performs a writing operation by using a raster scan method in which shot beams are emitted continuously and sequentially. When a desired pattern is to be written, blanking control is used to cause necessary beams to enter the beam ON state in accordance with the pattern.

Figure 2:
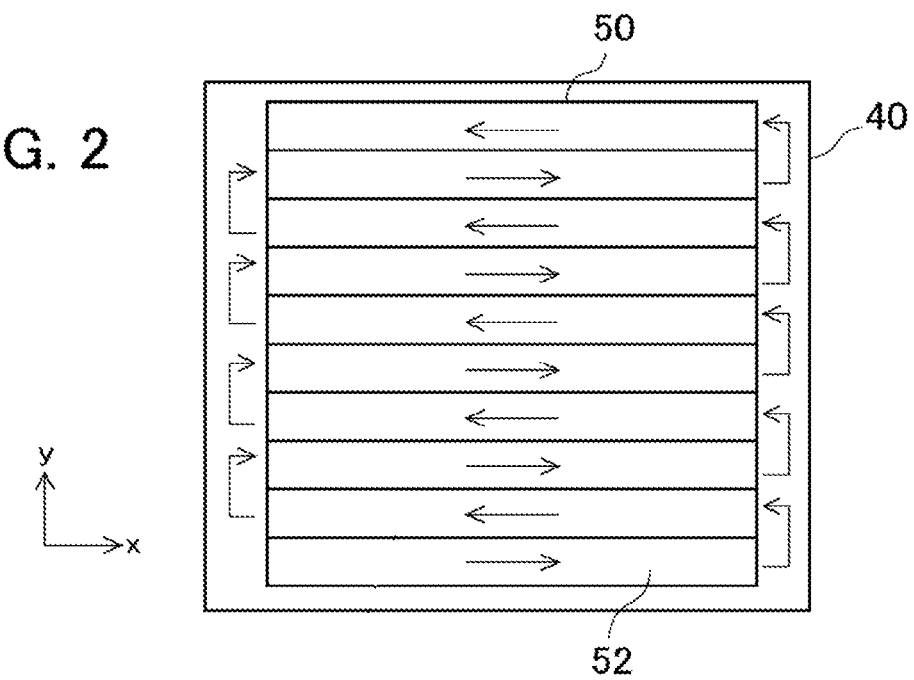
FIG. 2 is a diagram for describing an exemplary scan operation.

As illustrated in FIG. 2, a writing area 50 of the substrate 40 is virtually divided, for example, into multiple strip-shaped stripe areas 52 with a given width in the y direction. For example, the XY stage 32 is moved, and adjustment is made so that the irradiated area which may be irradiated with a shot of the multiple beams MB is positioned at the left end of the first stripe area 52. Then, the writing operation is started. The XY stage 32 is moved in the −x direction. Thus, writing may be performed relatively in the x direction.

After completion of writing of the first stripe area 52, the stage position is moved in the −y direction. Adjustment is made so that the irradiated area is positioned at the right end of the second stripe area 52, and the writing operation is started. The XY stage 32 is moved, for example, in the x direction. Thus, writing is performed in the −x direction.

In the third stripe area 52, writing is performed in the x direction; in the fourth stripe area 52, writing is performed in the −x direction. In this way, writing is performed with the direction being changed alternately, achieving reduction in the writing time. However, the case in which writing is performed with the direction being changed alternately is not limiting. When writing is performed in each stripe area 52, writing may be performed in the same direction.

FIGS. 3A to 3D are diagrams for describing an exemplary writing operation in a stripe area 52. FIGS. 3A to 3D illustrate an example in which writing is performed in the stripe area 52, for example, in the x and y directions by using multiple beams of 4×4.

The stripe area 52 is virtually divided, for example, in a mesh by using the beam size. In this example, while the irradiation position is shifted sequentially by one piece of mesh (one pixel) in the x direction or the y direction, exposure (writing) of one irradiated area for all of the multiple beams is completed with 16 shots. One pixel corresponds to an irradiation-unit area per beam. The area obtained through partitioning with the beam pitch is called a subfield. Writing in one subfield is performed with the same single beam. In this example, a subfield SF is constituted by 16 pixels.

Figure 3A:
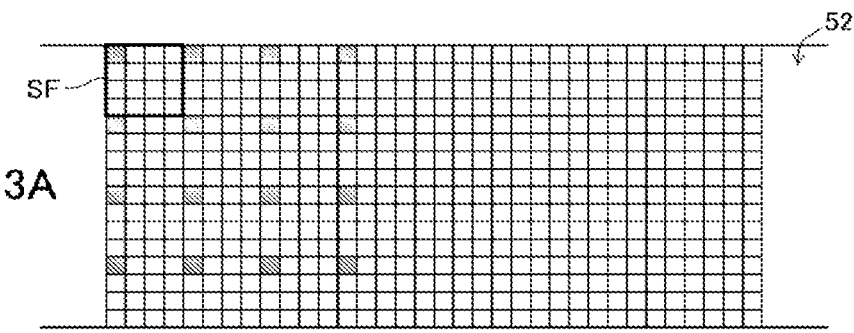
FIGS. 3A to 3D are diagrams for describing an exemplary writing operation.
Figure 3B:
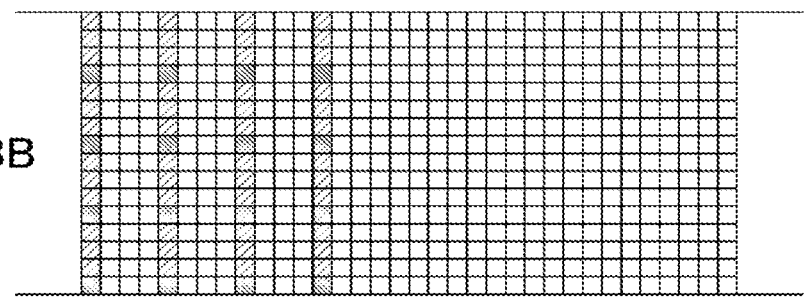
Figure 3C:
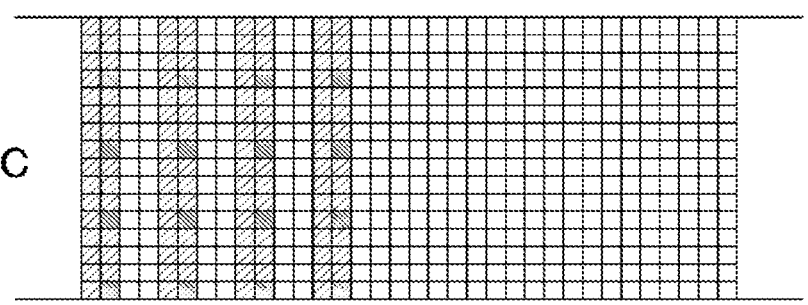
Figure 3D:
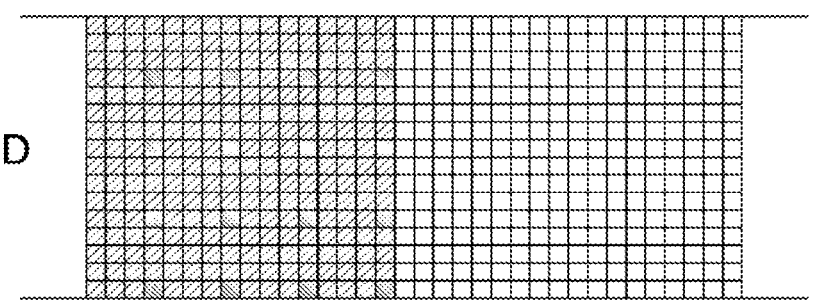

FIG. 3A illustrates the mesh areas irradiated with one shot. Then, as illustrated in FIG. 3B, while the position is shifted by one pixel each time in the y direction, the second, third, and fourth shots are made sequentially. Then, as illustrated in FIG. 3C, the position is shifted by one pixel in the x direction, and the fifth shot is made. Then, while the position is shifted by one pixel each time in the y direction, the sixth, seventh, and eighth shots are made sequentially. A similar operation is repeatedly performed. As illustrated in FIG. 3D, the remaining ninth to sixteenth shots are made sequentially. After the 16 shots, writing in the subfields SF is completed.

Pixels at which a figure pattern is present are irradiated with beams, and pixels at which no figure patterns are present are not irradiated with beams. Thus, a desired pattern is written.

The controller 1 reads writing data from a storage device (not illustrated), performs multiple stages of data conversion processing, and generates shot data specific to the device. In the shot data, the amount of irradiation, the irradiation position coordinates, and the like of each shot are defined.

The controller 1 obtains the irradiation time t by dividing the amount of irradiation of each shot by the current density. When the controller 1 is to make a corresponding shot, the controller 1 applies deflection voltages to the corresponding blankers of the blanking aperture array plate 24 so that the blankers enter the beam ON state only during the irradiation time t.

In addition, the controller 1 applies a deflection voltage to the deflector 28 so that the beams are deflected to the positions (coordinates) indicated by the shot data. Thus, the multiple beams used in the shot at that time are collectively deflected.

The deflector 28 collectively deflects the multiple beams. Thus, while the positions are shifted by one pixel each time in the subfields, the writing operation is performed.

Figure 4A:
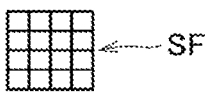
FIG. 4A is a diagram illustrating an ideal shape of a subfield.
Figure 4B:
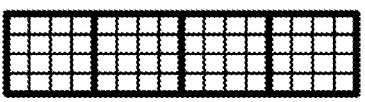
FIG. 4B is a diagram illustrating an exemplary connection of subfields.

The beams are positioned at equal intervals in the constant pitch. Therefore, the shape of a subfield SF is ideally quadrate (square) as illustrated in FIG. 4A. As illustrated in FIG. 4B, the upper side and the lower side of multiple subfields arranged in the horizontal direction extend linearly.

Figure 5A:
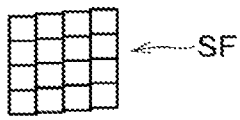
FIG. 5A is a diagram illustrating the shape of a rotated subfield.
Figure 5B:
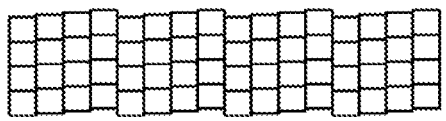
FIG. 5B is a diagram illustrating an exemplary connection of subfields.

However, distortion occurs in the shape of deflection caused by the deflector 28, for example, due to the positional relationship of multiple electrodes included in the deflector 28, or an influence on the output characteristics of the amplifier (not illustrated) applying the deflection voltage to these electrodes. As illustrated in FIG. 5A, a subfield SF is rotated. When a subfield SF is rotated, as illustrated in FIG. 5B, the upper side and the lower side of multiple subfields arranged in the horizontal direction form zigzags.

In the present embodiment, a line pattern (line-and-space pattern) which serves as an evaluation pattern is written. The amount of rotation (beam deflection shape) of subfields is obtained from the degree of unevenness of the shape of a line edge.

Figure 6:
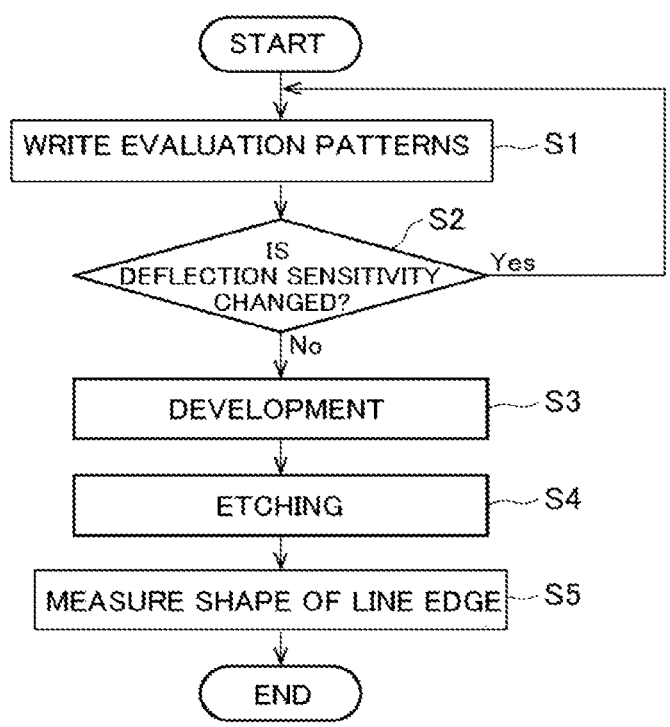
FIG. 6 is a flowchart for describing a method of obtaining a beam deflection shape.

FIG. 6 is a flowchart for describing a method of obtaining a beam deflection shape. Evaluation patterns are written on the substrate 40 (step S1). The substrate 40 is obtained, for example, by stacking a light-shielding film of chromium or the like and a resist on a silicon wafer. As evaluation patterns, a line-and-space pattern extending in the horizontal direction as illustrated in FIG. 7A and a line-and-space pattern extending in the vertical direction as illustrated in FIG. 7B are written. For example, the evaluation patterns are written by using the method illustrated in FIGS. 3A to 3D. The order of shots in the subfields is not limited to this.

A line-and-space pattern extending in the horizontal direction is written by exposing subfields by using beams arranged in the horizontal direction. The beams are deflected so that the subfield (writing area) for the beam in the j-th column (j is an integer satisfying 1≤j≤n−1) is continuously adjacent to the subfield (writing area) for the beam in the (j+1)th column.

Similarly, a line-and-space pattern extending in the vertical direction is written by exposing subfields by using beams arranged in the vertical direction.

The deflection sensitivity of the deflector 28 is changed, and evaluation patterns are written. After multiple evaluation patterns having different deflection sensitivity settings are written (step S2_No), a developing process is performed, and a resist pattern is formed (step S3). Then, the resist pattern is used as a mask to perform an etching process, and the light-shielding film is processed (step S4). After the etching process, the resist pattern is removed through an ashing process and the like.

A scanning electron microscope (SEM) is used to measure the degree of unevenness of an edge of each line pattern transferred to the light-shielding film (step S5).

For example, as illustrated in FIG. 8, the step height s of an edge portion is measured by using a SEM. The value obtained by dividing the step height s by the beam pitch is regarded as the degree of unevenness of the edge, and is used as the index of the amount of rotation of subfields. The step height s is, for example, the vertical-direction displacement, in a single subfield, of the upper side extending in the horizontal direction. The beam pitch may be measured by a SEM, or the design value may be used.

The roughness (LER: Line Edge Roughness or LWR: Line Width Roughness) may be used as the degree of unevenness of an edge.

The degree of unevenness of an edge is obtained for each deflection sensitivity, and the deflection sensitivity whose degree of unevenness is minimum is calculated as the optimal deflection sensitivity. In manufacturing writing, the deflector 28 is adjusted so that the calculated optimal deflection sensitivity is obtained. Thus, the pattern writing accuracy may be improved.

Thus, according to the present embodiment, the amount of rotation of subfields having the shape of deflection of the multiple beams may be measured with high accuracy, and the optimal deflection sensitivity of the deflector 28 may be obtained.

In improvement of the pattern writing accuracy, the angle at which the aperture array plates constituted by the shaping aperture array plate 23 and the blanking aperture array plate 24 are disposed is also an important condition. When the aperture array plates are disposed at a desired angle, as illustrated in FIG. 9, the xy directions of the writing area 50 are parallel to the horizontal and vertical sides of a multi-beam image 60. FIG. 9 illustrates an example of multiple beams of 8×8.

However, when the aperture array plates having been rotated are disposed, the multibeam image 60 may be rotated, which may affect the pattern writing accuracy.

To measure the angle of rotation of the aperture array plates, a line pattern extending in the horizontal direction is written as an evaluation pattern by using beams arranged in the horizontal direction. In addition, a line pattern extending in the vertical direction is written by using beams arranged in the vertical direction. However, the evaluation patterns are written in a writing mode different from the embodiment described above.

In the embodiment described above, the 16 pixels in a subfield corresponding to a beam interval are written by using the same beam. A subfield includes multiple pixels in each of the xy directions. In other words, the writing area for the beam in the j-th column (j is an integer satisfying 1≤j≤n−1) is continuously adjacent to the writing area for the beam in the (j+1)th column.

In contrast, when the angle of rotation of the aperture array plates is to be detected, the number of pixels in the stage tracking direction of a subfield is one. That is, pixels adjacent to each other in the stage tracking direction (stage moving direction) are written by using different beams. In other words, the writing area for the beam in the j-th column (j is an integer satisfying 1≤j≤n−1) is not continuously adjacent to the writing area for the beam in the (j+1)th column.

By using FIGS. 10A to 10D and FIGS. 11A to 11C, such a writing method will be described. Among the multiple beams of 8×8 illustrated in FIG. 9, eight beams A to H are used to write a line pattern. In FIGS. 10A to 10D and FIGS.

11A to 11C, for example, a pixel written by using beam A is denoted as "A". Arrows are illustrated for written pixel columns. In this example, the XY stage 32 is moved in the −x direction, and a line pattern extending in the horizontal direction (x direction) is written.

Figure 10A:
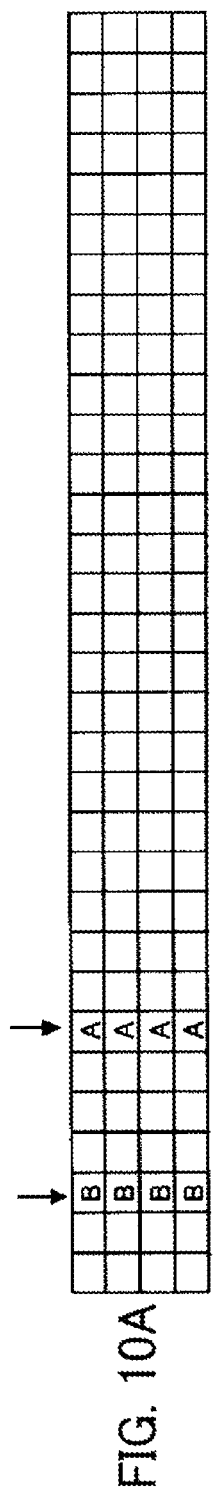
FIGS. 10A to 10D are diagrams for describing an exemplary writing operation.

When the writing area (stripe area) of the substrate enters the beam irradiated area, as illustrated in FIG. 10A, beams A and B are used to perform writing while the irradiation position is shifted only in the y direction (the direction orthogonal to the move direction of the XY stage 32).

Figure 10B:
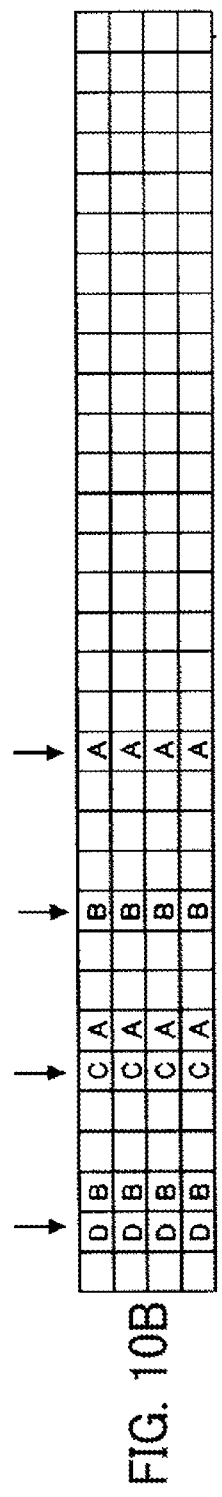

When the substrate moves in the −x direction, as illustrated in FIG. 10B, beams A to D are used to perform writing while the irradiation position is shifted in the y direction. In the process illustrated in FIG. 10B, writing is performed by using beam C in the area adjacent to the area in which writing is performed by using beam A.

Figure 10C:
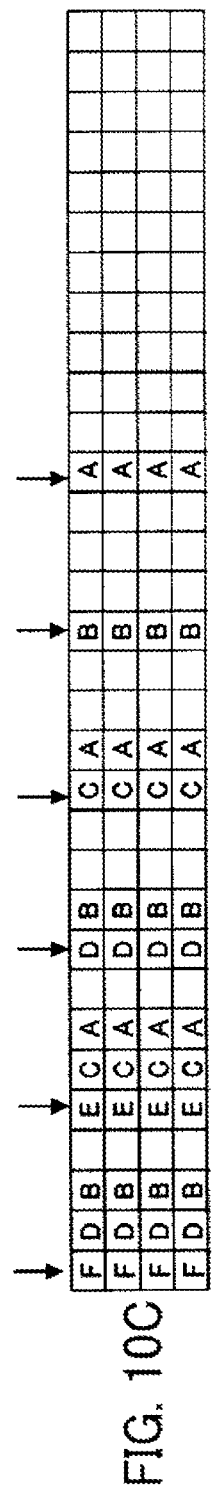

When the substrate further moves in the −x direction, as illustrated in FIG. 10C, beams A to F are used to perform writing while the irradiation position is shifted in the y direction.

Figure 10D:
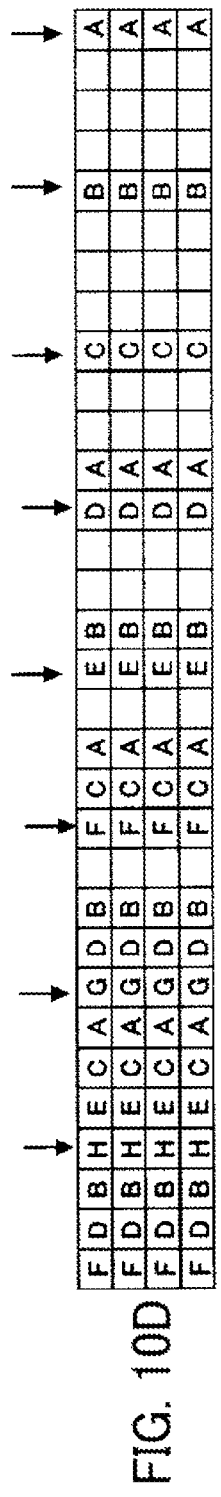

When the substrate further moves in the −x direction, as illustrated in FIG. 10D, beams A to H are used to perform writing while the irradiation position is shifted in the y direction.

Figures 11A, 11B, 11C:
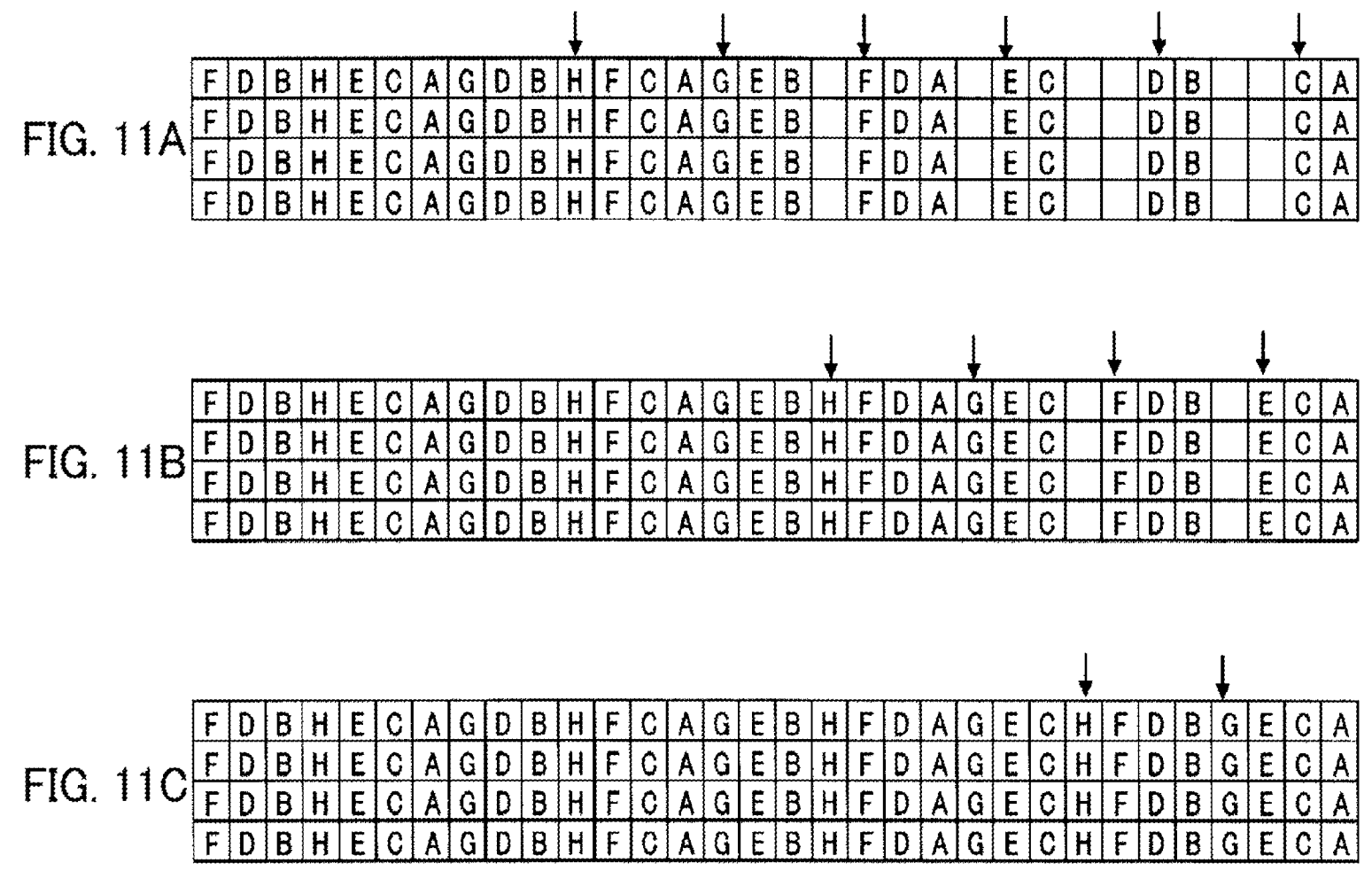

When the substrate further moves in the −x direction, as illustrated in FIG. 11A, beams C to H are used to perform writing while the irradiation position is shifted in the y direction.

When the substrate further moved in the −x direction, as illustrated in FIG. 11B, beams E to H are used to perform writing while the irradiation position is shifted in the y direction.

When the substrate further moves in the −x direction, as illustrated in FIG. 11C, beams G and H are used to perform writing while the irradiation position is shifted in the y direction.

Thus, a line pattern may be written. Pixels adjacent to each other in the stage moving direction are written by using different beams. The writing method illustrated in FIGS. 10A to 10D and FIGS. 11A to 11C is called a Y-scan because, for example, pixels written by using beam A are arranged in the vertical direction. In addition, beams arranged in the vertical direction are used to write a line pattern, which extends in the vertical direction, by using a writing method called a so-called X-scan (for example, pixels written by using beam A are arranged in the horizontal direction).

Figure 12:
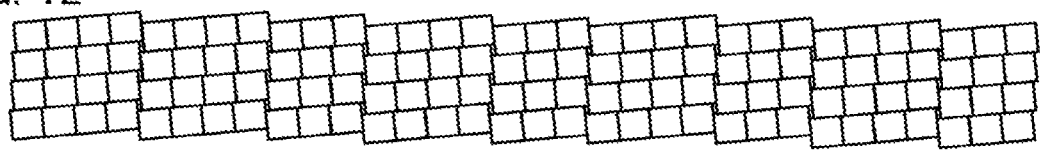
FIG. 12 is a diagram illustrating an exemplary written line pattern.

When the aperture array plates are attached at the desired angle, an edge of a written line pattern extends linearly. When the aperture array plates having been rotated are disposed, an edge of a line pattern forms a zigzag as illustrated in FIG. 12.

By changing the amount of rotation of the aperture array plates, multiple line patterns are written. Then, a SEM is used to measure the degrees of unevenness of the edges of the line patterns. For example, the value obtained by dividing the step height of an edge portion by the size of the blanking aperture array plate 24 is regarded as the degree of unevenness, and is used as the index of the amount of rotation of the aperture array plates. The roughness (LER, LWR, or the like) may be used as the degree of unevenness of an edge. The degree of unevenness of an edge of a line pattern extending in the horizontal direction is used as the index of the amount of Y rotation of the aperture array plates. The degree of unevenness of an edge of a line pattern extending in the vertical direction is used as the index of the amount of X rotation of the aperture array plates.

The degree of unevenness of an edge for each amount of rotation of the aperture array plates is obtained. The amount of rotation which produces the minimum degree of unevenness is calculated as the optimal amount of rotation. In manufacturing writing, the aperture array plates are installed by using the calculated optimal amount of rotation. Thus, the pattern writing accuracy may be improved.

Figure 13A:
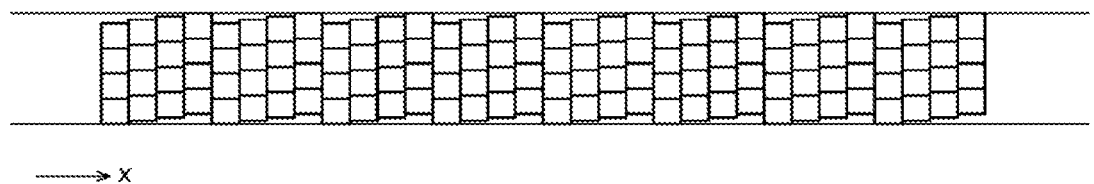
FIGS. 13A and 13B are diagrams illustrating exemplary written patterns.
Figure 13B:
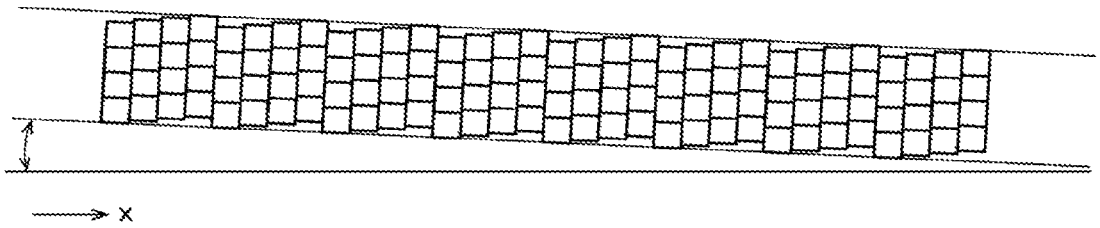

When subfields have been rotated and the aperture array plates are disposed at the desired angle, a line pattern written by using the method illustrated in FIGS. 3A to 3D is formed in the x direction (or the y direction) as illustrated in FIG. 13A. However, when subfields have been rotated and the aperture array plates which have also been rotated are disposed, as illustrated in FIG. 13B, a line pattern inclining with respect to the x direction is formed.

Thus, in the case where the aperture array plates are rotated, the inclination of the line pattern is decreased before calculation of the roughness. Thus, only the rotation of subfields may be evaluated.

In a line pattern written by using the method illustrated in FIGS. 3A to 3D, the effect of rotation of the aperture array plates is extremely small compared with the effect of the rotation of subfields, and may be therefore ignored.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of obtaining a beam deflection shape, the method comprising:
    using a plurality of beams to write a line pattern on a substrate by deflecting the plurality of beams, the plurality of beams being beams in the i-th row (i is an integer satisfying $1 \leq i \leq m$) among multiple charged-particle beams including beams of m rows and n columns (m and n are integers equal to or greater than two), the deflection being performed in such a manner that a writing area for a beam in the j-th column (j is an integer satisfying $1 \leq j \leq n-1$) is continuously adjacent to a writing area for a beam in the (j+1)th column, a resist being applied on the substrate;
    measuring a degree of unevenness of an edge of the line pattern; and
    obtaining a deflection shape of the beam based on the degree of unevenness.

2. The method according to claim 1,
    wherein, while deflection sensitivity is made variable, the line pattern is written for each deflection sensitivity, and
    wherein a deflection sensitivity which produces a minimum degree of unevenness of the line pattern is calculated.

3. The method according to claim 1,
    wherein the degree of unevenness is obtained by using a displacement of an edge of a portion of the line pattern and a beam pitch, the portion being written by a single beam.

4. The method according to claim 1,
wherein the degree of unevenness of the edge is LER (Line Edge Roughness) or LWR (Line Width Roughness).

5. The method according to claim 1,
wherein, when the line pattern is to be written, writing is performed by using the same single beam in an area obtained through partitioning with beam pitch of the multiple charged-particle beams.

6. A method of obtaining an arrangement angle of a blanking aperture array plate, the method comprising:

passing a charged-particle beam through a plurality of openings provided in a shaping aperture array plate and forming multiple charged-particle beams including beams of m rows and n columns (m and n are integers equal to or greater than two);

performing blanking deflection by using a blanking aperture array plate including a blanker corresponding to each beam of the multiple charged-particle beams, the blanking deflection being performed in such a manner that a plurality of beams in the i-th row (i is an integer satisfying $1 \leq i \leq m$) irradiate a substrate mounted on a moving stage, a resist being applied on the substrate;

deflecting the plurality of beams and writing a line pattern on the substrate, the deflection being performed in a direction orthogonal to a move direction of the stage in such a manner that a writing area for a beam in the j-th column (j is an integer satisfying $1 \leq j \leq n-1$) is not continuously adjacent to a writing area for a beam in the (j+1)th column;

measuring a degree of unevenness of an edge of the line pattern; and obtaining an arrangement angle of the shaping aperture array plate and the blanking aperture array plate based on the degree of unevenness.

7. The method according to claim 6,
wherein, while the arrangement angle of the shaping aperture array plate and the blanking aperture array plates is made variable, the line pattern is written for each arrangement angle, and
wherein an arrangement angle that produces a minimum degree of unevenness of the line pattern is calculated.

8. The method according to claim 6,
wherein the degree of unevenness is obtained by using a displacement of an edge of the line pattern and a size of the blanking aperture array plate.

9. The method according to claim 6,
wherein the degree of unevenness of the edge is LER (Line Edge Roughness) or LWR (Line Width Roughness).

10. The method according to claim 6,
wherein a first pixel and a second pixel are written by using different beams, the first pixel and the second pixel being adjacent to each other in a move direction of the stage.

* * * * *